(12) United States Patent
Winer et al.

(10) Patent No.: US 6,525,922 B2
(45) Date of Patent: Feb. 25, 2003

(54) HIGH PERFORMANCE VIA CAPACITOR AND METHOD FOR MANUFACTURING SAME

(75) Inventors: Paul Winer, Santa Clara, CA (US); Richard H. Livengood, San Jose, CA (US); Suresh Ramalingam, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 09/751,358

(22) Filed: Dec. 29, 2000

(65) Prior Publication Data

US 2002/0085336 A1 Jul. 4, 2002

(51) Int. Cl.$^7$ ................................ H01G 4/228
(52) U.S. Cl. ............... 361/306.3; 361/312; 361/313; 361/321.1; 361/321.4; 438/248; 438/249; 257/653; 257/758
(58) Field of Search .............. 361/306.3, 306.1, 361/321.1, 321.4, 328, 311, 313, 321, 309, 321.3; 438/248, 249; 257/653, 758

(56) References Cited

U.S. PATENT DOCUMENTS

| | | | | |
|---|---|---|---|---|
| 5,055,966 A | * | 10/1991 | Smith et al. | |
| 5,061,686 A | * | 10/1991 | Ruby. | |
| 5,337,207 A | * | 8/1994 | Jones et al. | 361/321.1 |
| 5,854,119 A | * | 12/1998 | Wu et al. | 438/396 |
| 5,929,510 A | * | 7/1999 | Geller et al. | 257/635 |
| 6,090,661 A | * | 7/2000 | Perng et al. | 438/248 |
| 6,313,537 B1 | * | 11/2001 | Lee et al. | 257/758 |
| 6,370,013 B1 | * | 4/2002 | Lino et al. | 361/306.3 |

* cited by examiner

*Primary Examiner*—Dean A. Reichard
*Assistant Examiner*—Ha I Nguyen
(74) *Attorney, Agent, or Firm*—Schwegman, Lundberg, Woessner & Kluth, P.A.

(57) ABSTRACT

A capacitor structure is formed on a substrate member having one or more via holes therein. Metallization portions within the via holes of the substrate member form part of the plates of the capacitor.

25 Claims, 9 Drawing Sheets

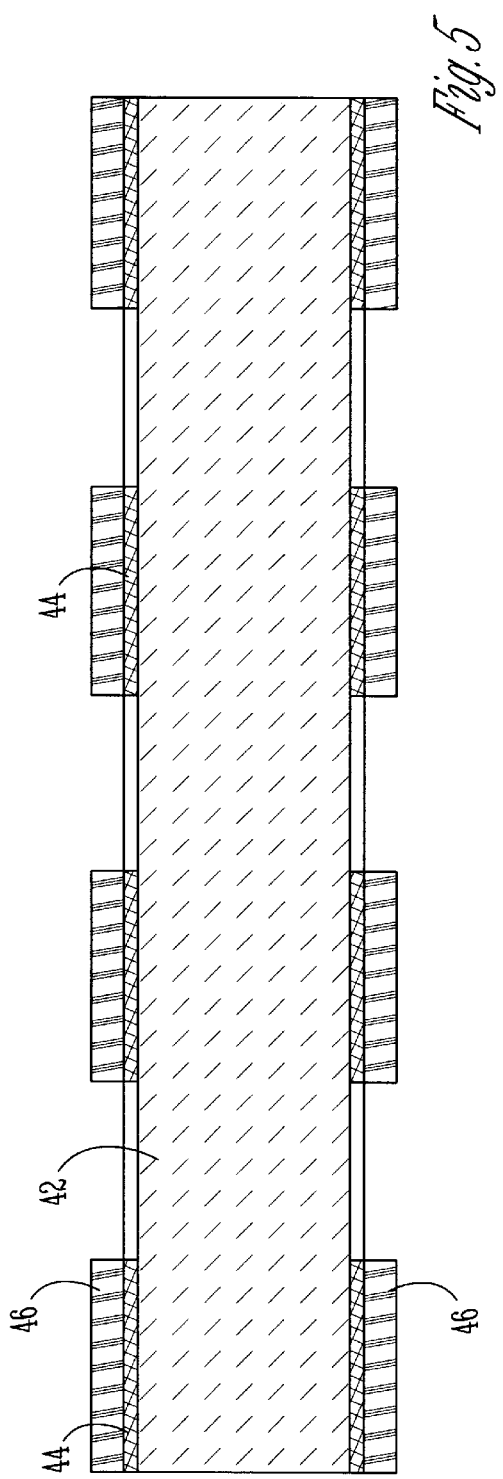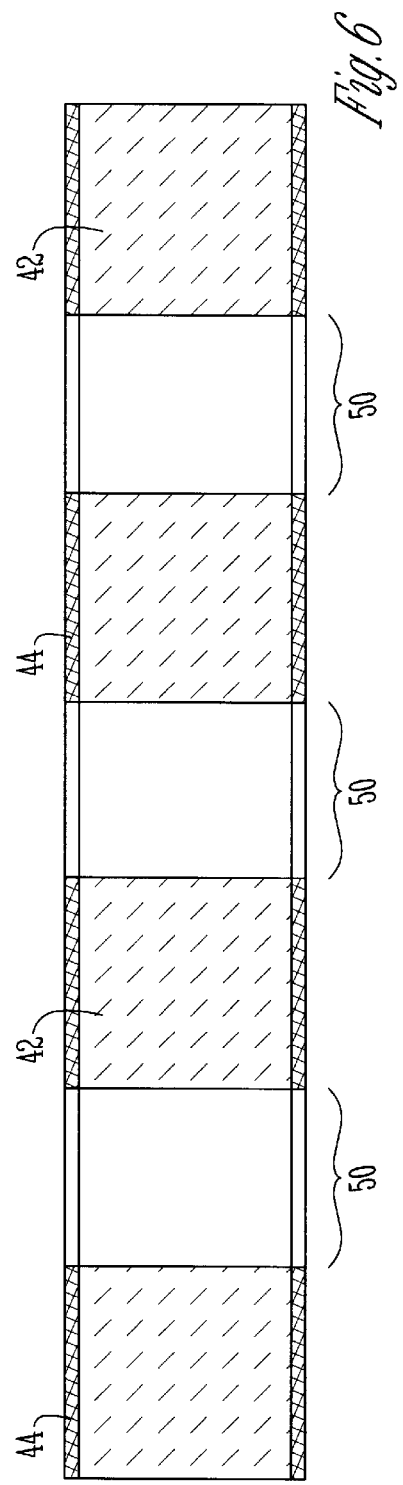

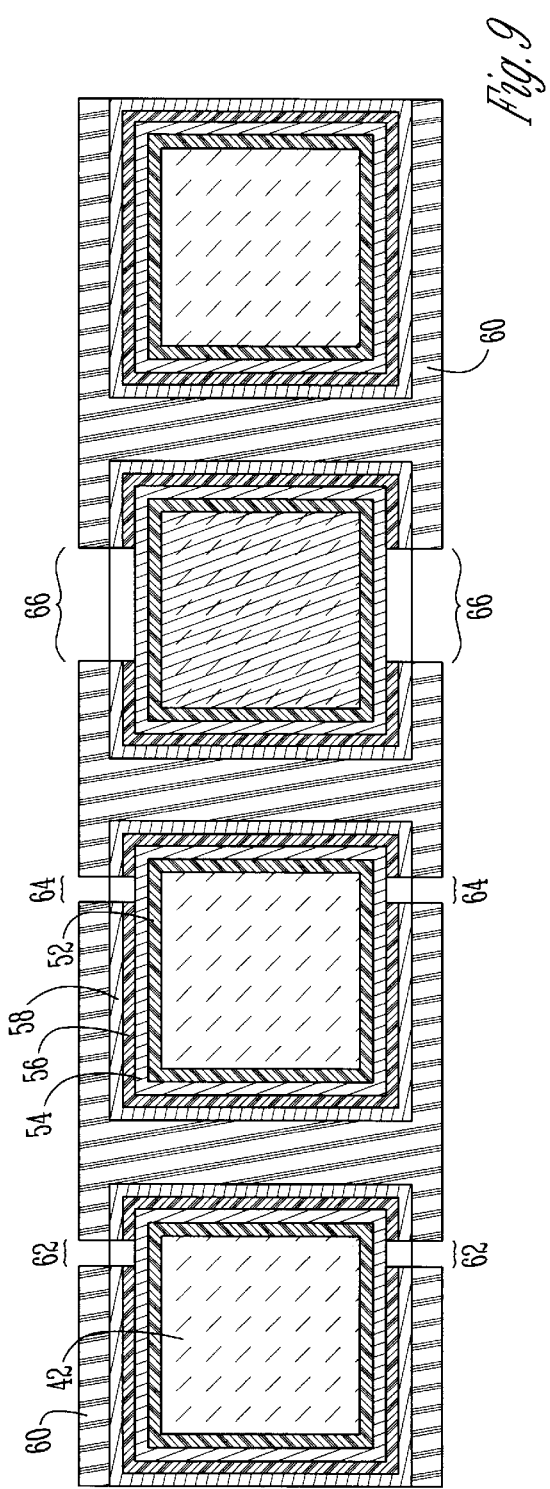
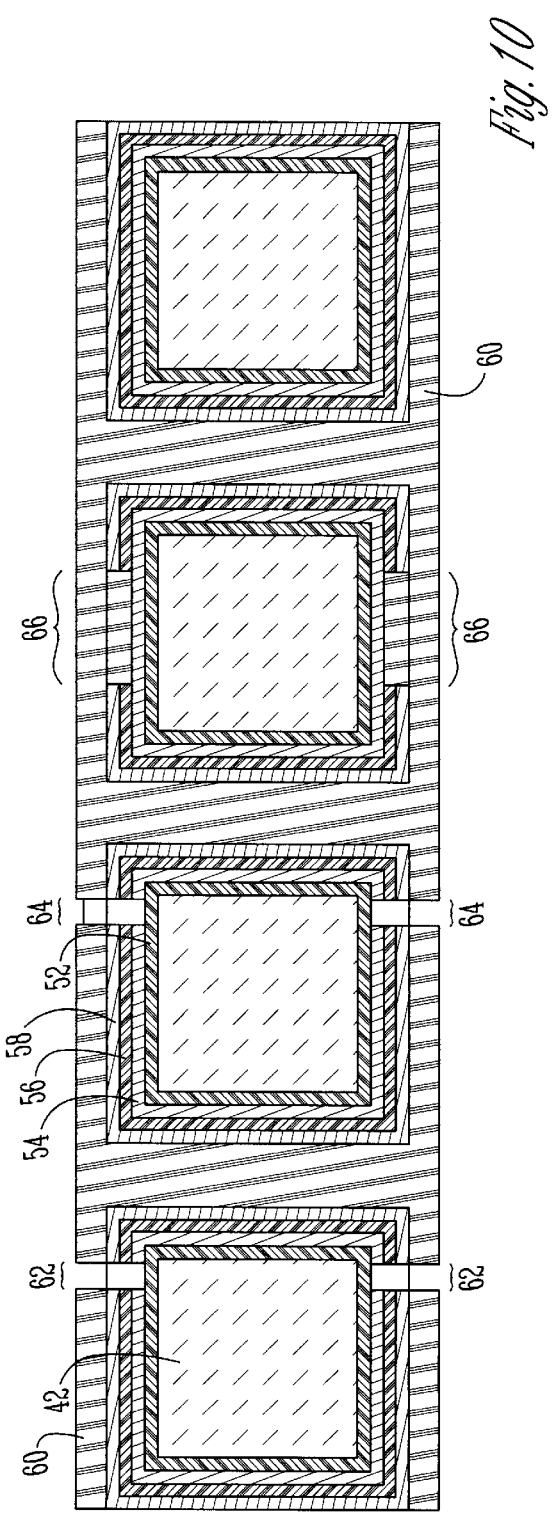

HIGH PERFORMANCE VIA CAPACITOR AND METHOD FOR MANUFACTURING SAME

FIELD OF THE INVENTION

The invention relates generally to integrated circuits and, more particularly, to capacitor structures for use therein.

BACKGROUND OF THE INVENTION

There is an ongoing need in the integrated circuit (IC) industry for high performance capacitors. This need is particularly strong in the area of digital processing devices (e.g., microprocessors). For example, as the performance levels of digital processing devices continue to rise, there is an increasing need for capacitor structures that are capable of performing de-coupling functions for these high speed devices. Such de-coupling capacitors are often called upon to provide high di/dt (i.e., high-rate current change) operation for these processing devices. In the past, conventional capacitor structures (e.g., parallel plate capacitors) were often implemented on the IC package to provide de-coupling capacitance within the device. It is anticipated, however, that these conventional capacitor structures will not be capable of providing the performance levels required by next generation digital processing devices.

In a more recent approach, de-coupling capacitor structures have been implemented on the back of the silicon die. However, such techniques have proven difficult to implement. For example, the high temperature anneal process required by many of the high dielectric constant insulating materials used in such capacitors will often create problems when attempting to meet the allowable thermal budget associated with a process. Techniques have also been proposed for building up layers on the microprocessor chip to provide the de-coupling structures. However, these techniques can also present thermal budget problems when high dielectric constant insulating materials are used. In addition, these techniques will often require a relatively large number of alternating layers to achieve the required capacitance. A number of architectural de-coupling approaches have also been proposed and implemented including, for example, techniques involving clock throttling and microcode changes. These architectural solutions, however, can result in significant reductions in performance within a processor.

BRIEF DESCRIPTION OF THE DRAWINGS

FIGS. 3–13 are diagrams illustrating a method for fabricating an interposer unit having a de-coupling capacitor in accordance with one embodiment of the present invention.

DETAILED DESCRIPTION

Figure 1:
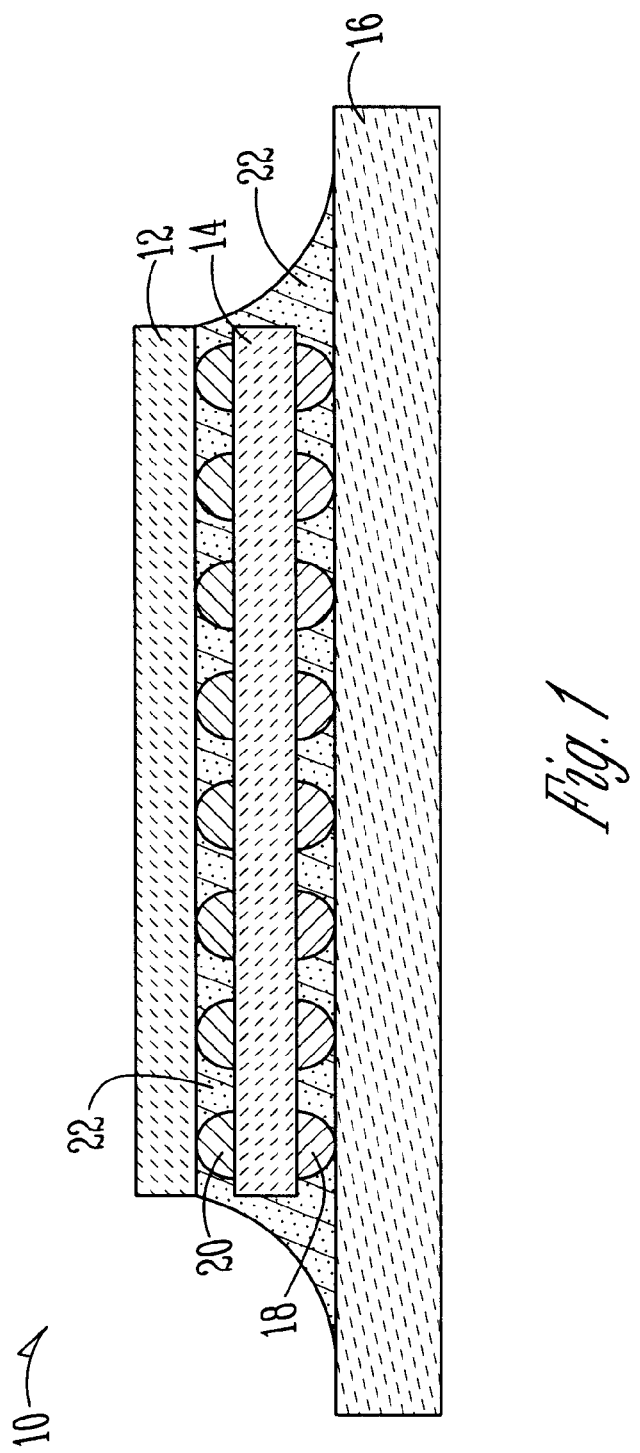
FIG. 1 is a sectional side view illustrating a microprocessor assembly in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a high performance capacitor structure that is implemented using via holes in a substrate material. That is, the plates of the capacitor structure each include conductive portions located within the via holes of the substrate. By using via holes to form the capacitor plates, a relatively large effective plate area can be achieved within a smaller region than normally possible using a conventional parallel plate approach. In addition, it was found that the use of a large number of parallel-connected vias in the capacitor structure can produce a significant reduction in the series inductance and resistance associated with the capacitor. As can be appreciated, this reduction in inductance and resistance will typically enhance the capacitor's ability to handle the high di/dt demands of many high performance processors. The capacitor structure is also capable of implementation with a very low profile (e.g., 1 millimeter or less). The capacitor structure can be used in any of a large number of integrated circuit applications. In one application, for example, the capacitor structure is used to provide de-coupling within a high-speed digital processing unit (e.g., a microprocessor). The capacitor structure is capable of providing the enhanced capacitor performance required for next generation high speed digital processors.

FIG. 1 is a sectional side view illustrating a microprocessor assembly 10 in accordance with one embodiment of the present invention. As illustrated, the microprocessor assembly 10 includes a die 12, an interposer unit 14, and a package substrate 16. Although not shown, the microprocessor assembly 10 will typically be housed within an IC package having a plurality of external leads to provide electrical communication between the assembly 10 and circuitry outside the package (e.g., circuitry on a computer motherboard). The external leads are conductively coupled inside the IC package to corresponding terminals on the package substrate 16. The die 12 is a semiconductor chip structure that includes the digital processing circuitry of the microprocessor. The die 12 includes a plurality of contact pads on a lower surface thereof that are each conductively coupled to operative portions of the processing circuitry. The interposer unit 14 is located between the die 12 and the package substrate 16 to provide, among other things, signal communication therebetween. More importantly, the interposer unit 14 provides a de-coupling capacitance between the supply terminals (e.g., $V_{CC}$ and $V_{SS}$) that are providing power to the circuitry of the die 12. As will be described in greater detail, the de-coupling capacitance within the interposer unit 14 is implemented using via holes within a supporting substrate member.

As shown in FIG. 1, the microprocessor assembly 10 uses flip chip technology to interconnect the various components. Flip chip technology is an interconnection scheme that allows a number of contact terminals on a first structure to be simultaneously coupled to corresponding terminals on a second structure. Bumps of solder (or another metal alloy) are first deposited on the contact pads of the first structure. These solder bumps are then aligned with corresponding contact pads on the second structure. After alignment, the solder bumps are conductively bonded to the contact pads of the second structure using, for example, solder reflow or ultrasonic bonding. With reference to FIG. 1, solder bumps 18 on the underside of the interposer unit 14 are aligned with and bonded to contact pads on the package substrate 16, as described above. Contact pads on the underside of the die 12 are then aligned with and bonded to solder bumps 20 on the top of the interposer unit 14 in a similar manner. It should be appreciated that the solder bumps 18, 20 could alternatively (or in addition) have been placed on the package substrate 16 and the die 12, respectively, before alignment. Typically, the contact pattern on the top of the interposer unit 14 will be the same as the pattern on the surface of the package substrate 16 (although in at least one embodiment a different pattern is used). The number and arrangement of the contacts on the underside of the die 12 will typically be specific to the particular implementation. As shown in FIG. 1, an optional composite underfill material 22 (e.g., epoxy) can be provided to fill the gaps between the bumps 18, 20 to provide rigidity and structural integrity to the assembly 10. It should be appreciated that other methods or combinations of methods for providing interconnection between the die 12, the interposer unit 14, and the package substrate 16 can alternatively be used, as will be apparent to a person of ordinary skill in the art.

Figure 2:
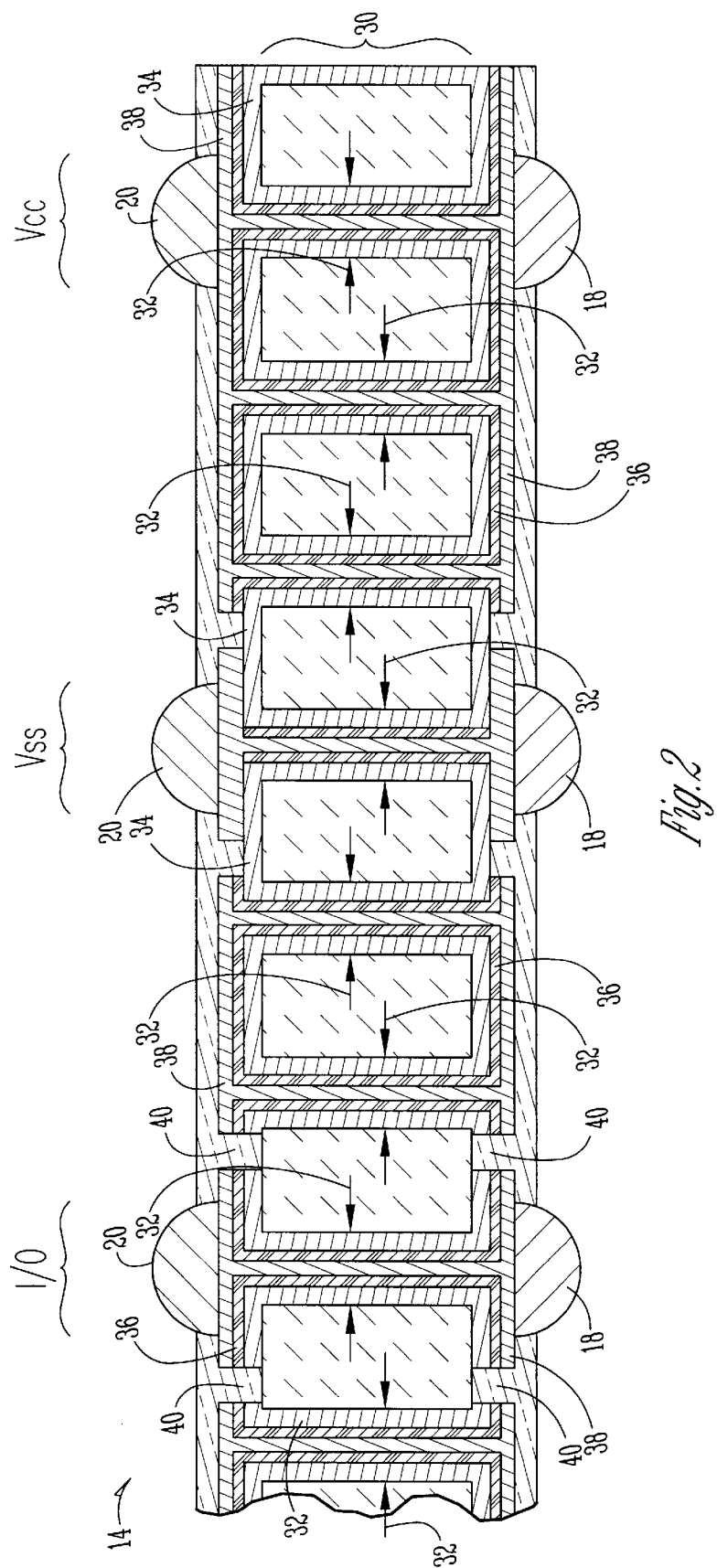
FIG. 2 is a sectional side view of an interposer unit having a de-coupling capacitor in accordance with one embodiment of the present invention.

FIG. 2 is a sectional side view of a portion of the interposer unit 14 of FIG. 1 in one embodiment of the present invention. As illustrated, the interposer unit 14 includes a plurality of solder bumps 18 on a lower surface thereof to provide electrical connection to the package substrate 16 and a plurality of solder bumps 20 on an upper surface thereof to provide electrical connection to the die 12. In addition, each of the solder bumps 20 on the upper surface of the interposer unit 14 has a corresponding solder bump 18 on the bottom surface of the unit 14. The interposer unit 14 includes a conductive connection between each of these solder bump "pairs" to conductively couple a contact pad on the die 12 to a corresponding contact pad on the package substrate 16. In the illustrated embodiment, for example, one of the solder bump pairs of the interposer unit 14 corresponds to a first supply terminal $V_{CC}$ that is to be coupled to the die 12. Another solder bump pair corresponds to a second supply terminal $V_{SS}$ that is to be coupled to the die 12. Thus, the $V_{CC}$ contact pad on the package substrate 16 will be directly connected to the $V_{CC}$ terminal on the die 12 and the $V_{SS}$ contact pad on the package substrate 16 will be directly connected to the $v_{SS}$ terminal on the die 12 through the interposer unit 14 to provide power to the die 12 during circuit operation. Similarly, a plurality of other solder bump pairs will typically exist that each correspond to one of the input/output connections between the die 12 and the package substrate 16. These pairs will also be directly connected through the interposer unit 14. In addition to the through connections described above, the interposer unit 14 also provides a de-coupling capacitance between the $V_{CC}$ terminal and the $V_{SS}$ terminal of the die 12.

With reference to FIG. 2, the interposer unit 14 is formed from a single substrate member 30 having a plurality of via holes 32 extending there through. In a preferred approach, the substrate member 30 consists of a semiconductor material (such as, for example, silicon or germanium), although other substrate materials can alternatively be used. As illustrated, the interposer unit 14 is formed by building up various material layers on the substrate member 30 both inside and outside the via holes 32. A first metallization layer 34 forms an inner metallic member of the interposer unit 14. The first metallization layer 34 is covered with an insulating layer 36 which, in turn, is covered with a second metallization layer 38. The solder bumps 18, 20 corresponding to the $V_{CC}$ terminal are conductively coupled to the second metallization layer 38 which provides the $V_{CC}$ connection through the interposer unit 14. Similarly, the solder bumps 18, 20 corresponding to the $V_{SS}$ terminal are conductively coupled to the first metallization layer 34 which provides the $V_{SS}$ connection through the interposer unit 14. In addition, the relatively thin insulating layer 36 between the first and second metallization layers 34, 38 causes a relatively large capacitance to be formed between the first and second metallization layers 34, 38 and thus between the supply terminals $V_{CC}$ and $V_{SS}$. Because the via holes 32 are used, the effective surface area of the capacitor plates is relatively large for the size of the interposer unit 14, thus resulting in a relatively large de-coupling capacitance within the interposer unit 14. Also, as the number of via holes 32 that are used to form the capacitor is increased, the series resistance and inductance of the capacitor will correspondingly decrease as the incremental inductance and capacitance associated with each via is added in parallel. This decrease in series inductance and resistance is beneficial for circuits (e.g., microprocessor circuits) that may require quick changes in current (i.e., high di/dt) to compensate for such things as voltage droop and the like.

In the illustrated embodiment, a portion of the first metallization layer 34 acts as the first plate of the de-coupling capacitor and a portion of the second metallization layer 38 acts as the second plate of the de-coupling capacitor. In the region of the I/O connection, however, other portions of the first and second metallization layers 34, 38 are isolated from the portions providing the de-coupling capacitance and thus do not contribute to the total capacitance. This is because the I/O connections do not generally require a shunt capacitance. With reference to FIG. 2, the solder bumps 18, 20 corresponding to the I/O terminal are each coupled to the first metallization layer 38 to provide the conductive I/O connection through the interposer unit 14 (i.e., through the corresponding via hole 32). However, channels 40 have been etched through the first and second metallization layers 34, 38 in the region about the I/O connection to isolate the layers 34, 38 as described above. Thus, the I/O connection through the interposer unit 14 is not coupled to either plate of the de-coupling capacitor. A similar isolation technique is preferably used for each of the other I/O connections through the interposer unit 14.

Figure 3:
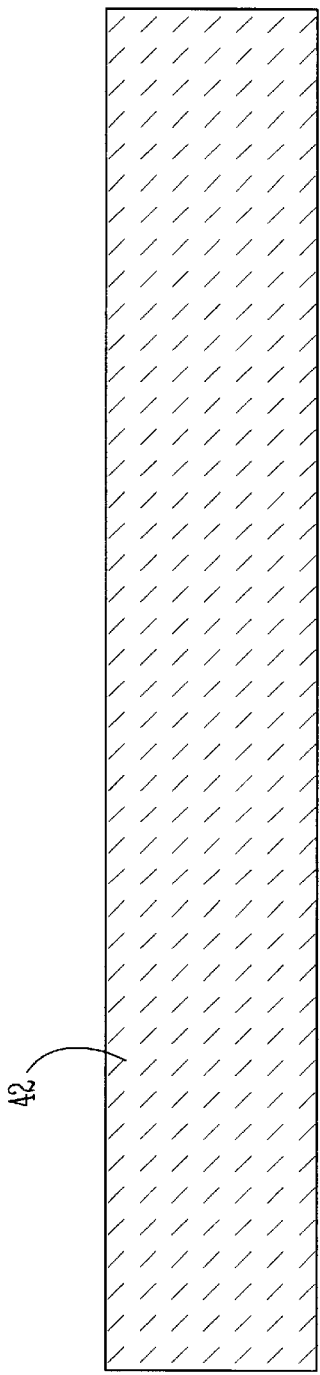
Figure 4:
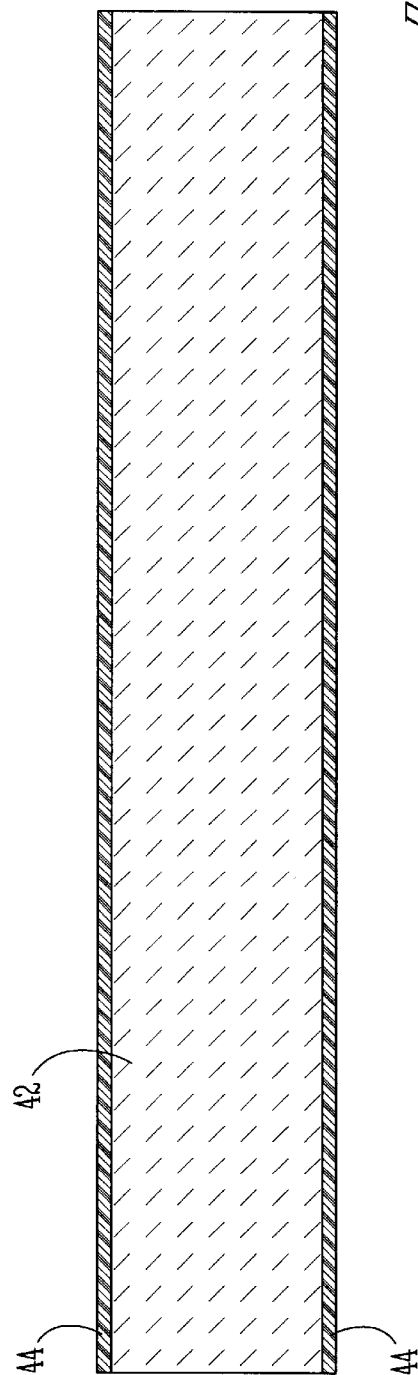

FIGS. 3–13 are diagrams illustrating a method for fabricating an interposer unit in accordance with one embodiment of the present invention. As will be described in greater detail, the illustrated method is a four mask process. FIG. 3 is a sectional side view of a substrate member 42 that acts as the structural backbone of the interposer. In the illustrated embodiment, the substrate member 42 consists of a silicon chip. It should be appreciated, however, that many alternative substrate materials can also be used including, for example, other semiconductor materials, glass, polymers, and ceramics. In one approach, a multitude of interposer units are simultaneously formed on a single semiconductor wafer that is later cut into individual interposer chips. As shown in FIG. 4, a hard mask material 44 is first deposited upon the upper and lower surfaces of the substrate member 42 for subsequent use in forming via holes through the substrate member 42. The hard mask material 44 can include, for example, silicon dioxide or aluminum, although other materials are also possible. After the hard mask material 44 has been deposited, photolithography techniques are used to define the hard mask that will be used to create the via holes. As shown in FIG. 5, in one approach, a photoresist mask 46 is formed on the upper and lower layers of the hard mask material 44 for use in defining the hard mask pattern. The hard mask material 44 is then etched into the desired mask pattern using the photoresist mask 46. A wet or dry etch can be performed to define the hard mask. It should be appreciated that the use of a hard mask is optional for defining the via holes in accordance with the present invention. For example, in at least one embodiment, a photoresist mask is used to create the via holes directly.

With reference to FIG. 6, once the hard mask material 44 has been appropriately defined, the via holes 50 are formed through the substrate member 42. In a preferred approach, deep via etching techniques are used to form the vias holes 50 to achieve a relatively high aspect ratio (i.e., via holes having relatively vertical walls). In one embodiment, for example, an inductively coupled plasma (ICP) etching technique (e.g., the Bosch process) is used to form deep vias having aspect ratios as high as 20:1 or more with diameters of approximately 5 micrometers. In another embodiment, electrochemical methods are used to form the via holes 50. In yet another embodiment of the invention, a glass substrate is used and ultrasonic techniques are employed to form the via holes 50. It should be appreciated that high aspect ratio vias are not a requirement in the present invention. For example, in one approach, laser ablation techniques are used to form the vias. Wet etch processes can also be employed. After the via holes 50 have been formed, the remaining hard mask material 44 is removed.

Figure 7:
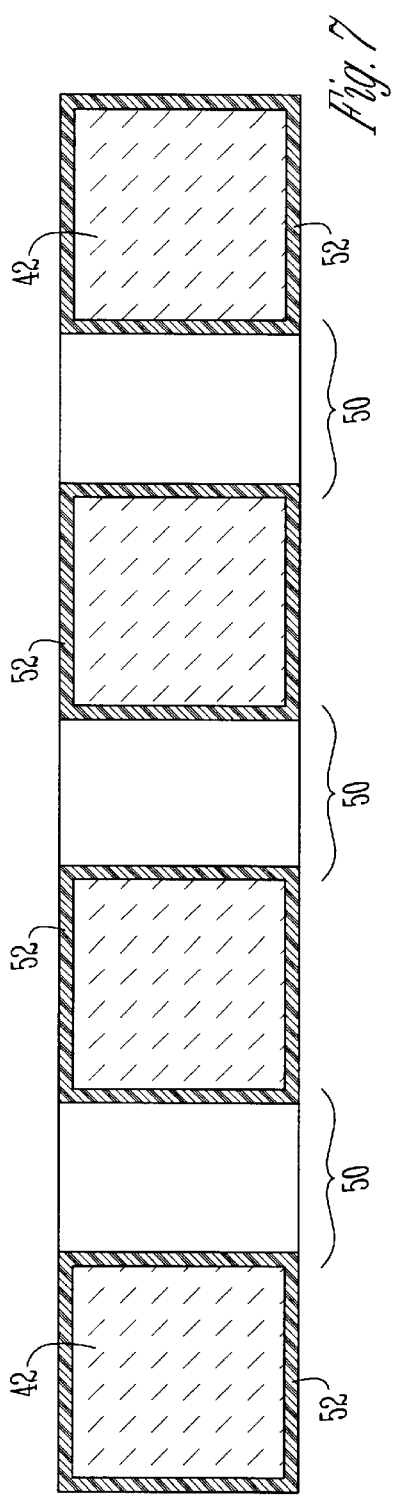
Figure 8:
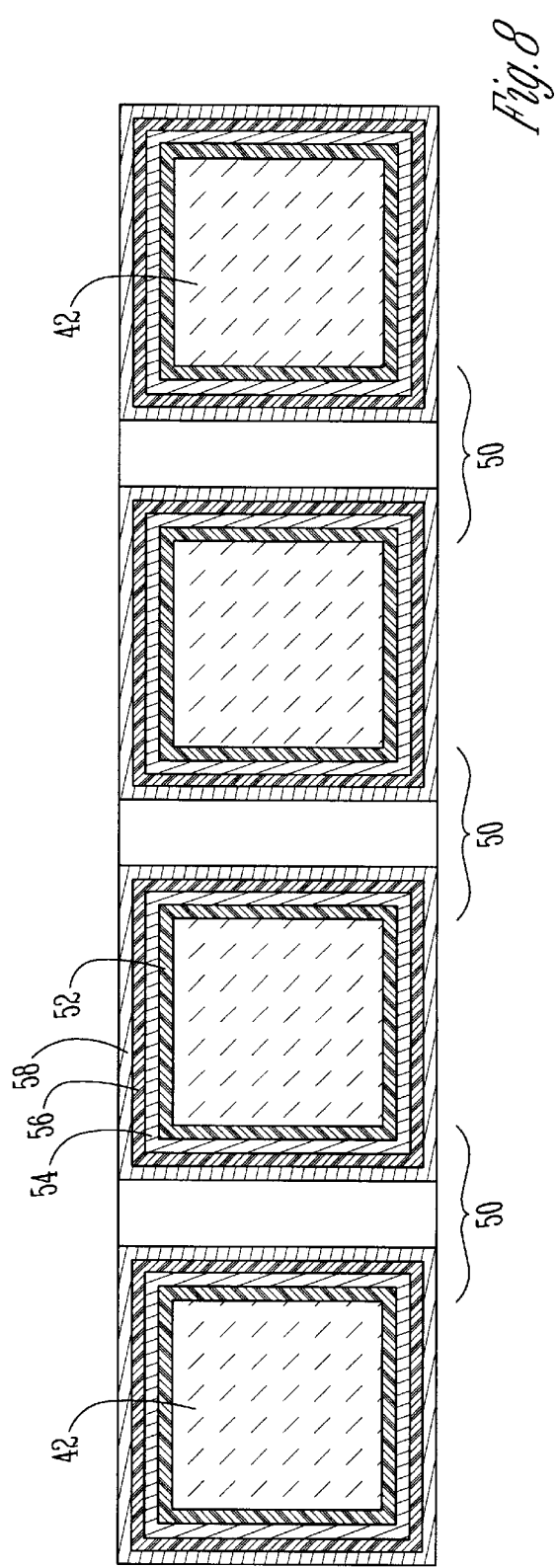

As shown in FIG. 7, an isolation layer 52 is next provided on the outer surface of the substrate member 42 to isolate the substrate material from the subsequently deposited metallization layers. In a preferred approach, the isolation layer 52 will consist of a thin oxide layer (e.g., $S_iO_2$) that is grown on the surface of the substrate 42. The isolation layer 52 covers both the upper and lower surfaces of the substrate member 42 as well as the interior walls of the via holes 50. The isolation layer 52 is an optional layer, the need for which will generally depend upon the substrate material (e.g., a glass substrate will not typically require an isolation layer). After the isolation layer 52 has been formed, a first metallization layer 54 is deposited on an outer surface of the isolation layer 52. As with the isolation layer 52, the first metallization layer 54 is applied over the upper and lower surfaces of the substrate member 42 and over the interior walls of the via holes 50. In a similar manner, an insulating layer 56 is next deposited on the first metallization layer 54 and a second metallization layer 58 is then deposited on the insulating layer 56. The resulting sandwich of layers is illustrated in FIG. 8.

The insulating layer 56 is preferably formed using a high dielectric constant material such as, for example, tantalum pentoxide ($Ta_2O_5$). Such materials will typically require a high temperature anneal after application. In a preferred approach, the insulating layer 56 will be made relatively thin to increase the capacitance between the two metallization layers 54, 58. In one embodiment, for example, a 250 Angstrom thick layer of $Ta_2O_5$ is used. Other possible insulating materials include, for example, lead zirconium titanium (PZT), barium strontium titanate (BST), zirconium oxide ($ZrO_2$), hafnium oxide ($HfO_2$), lanthanum oxide ($La_2O_3$) yttrium oxide ($Y_2O_3$), silicon oxide/silicon nitride/silicon oxide (ONO), and others. In one embodiment, the first and second metallization layers 54, 58 are formed from ruthenium. Ruthenium is used because of its compatibility with $Ta_2O_5$. In one implementation, ruthenium films having a thickness of approximately 250 Angstroms are used. It should be appreciated that many alternative metals and/or alloys can be used to form the first and second metallization layers 54, 58 including, for example, copper, aluminum, tungsten, platinum, iridium, and others. The first and second metallization layers 54, 58 and the insulating layer 56 can be deposited using any of a number of different deposition techniques including, for example, ion beam deposition (IBD) and chemical vapor deposition (CVD).

Figure 11:
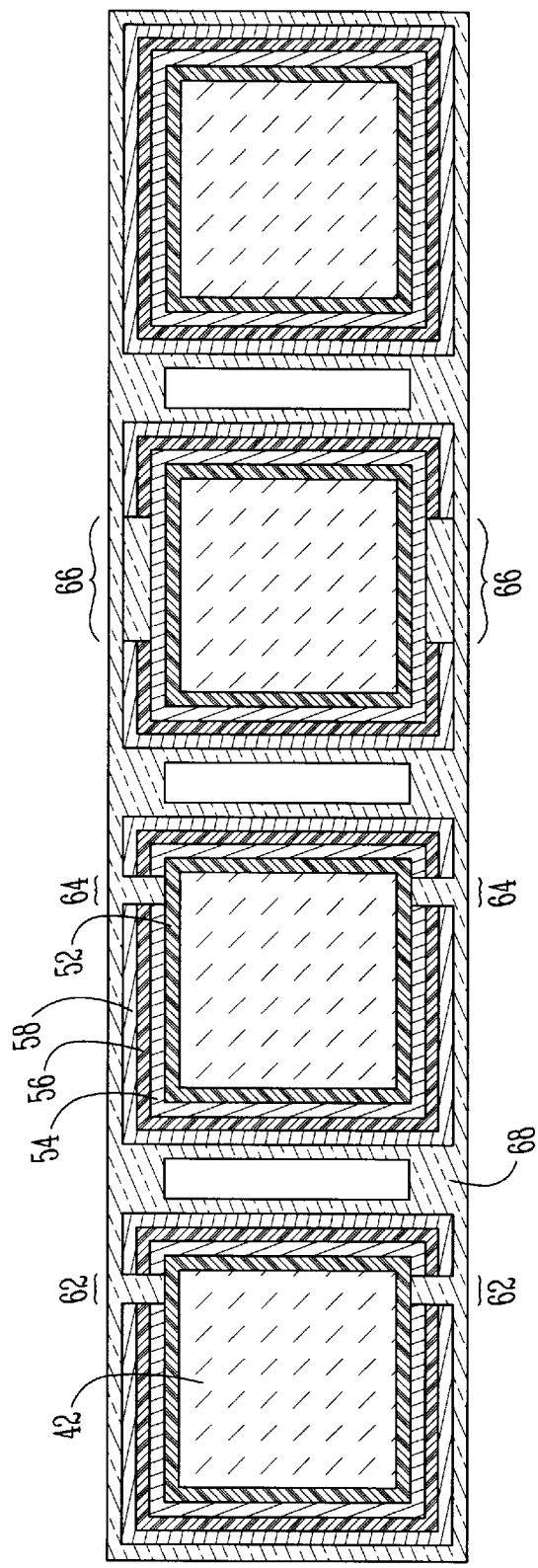

As illustrated in FIG. 9, after the second metallization layer 58 has been deposited, the entire assembly is covered with a layer of photoresist 60. The photoresist 60 is then patterned into a mask for use in etching the second metallization layer 58. As shown, the photoresist mask is used to etch a series of notches 62, 64, 66 through the second metallization layer 58 and the insulating layer 56 to expose the first metallization layer 54 below. Referring to FIG. 10, the notches 66 are then filled with additional photoresist material 60 and the resulting photoresist mask is used to etch through the first metallization layer 54 within the other notches 62, 64 to expose the underlying isolation layer 52. The photoresist material 60 is then removed and a passivation layer 68 is applied, as shown in FIG. 11. The passivation layer 68 encapsulates the interposer to protect the structures therein from the surrounding environment. The passivation layer 68 will typically be made of glass or a similar material.

Figure 12:
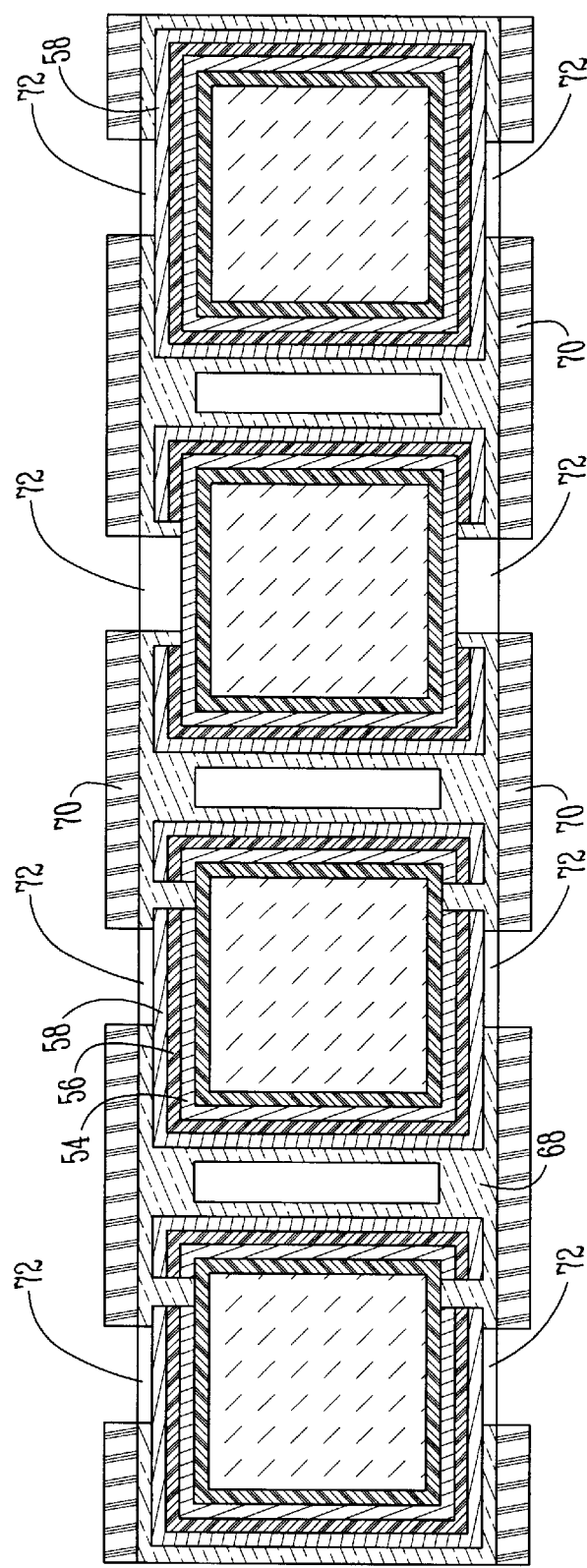
Figure 13:
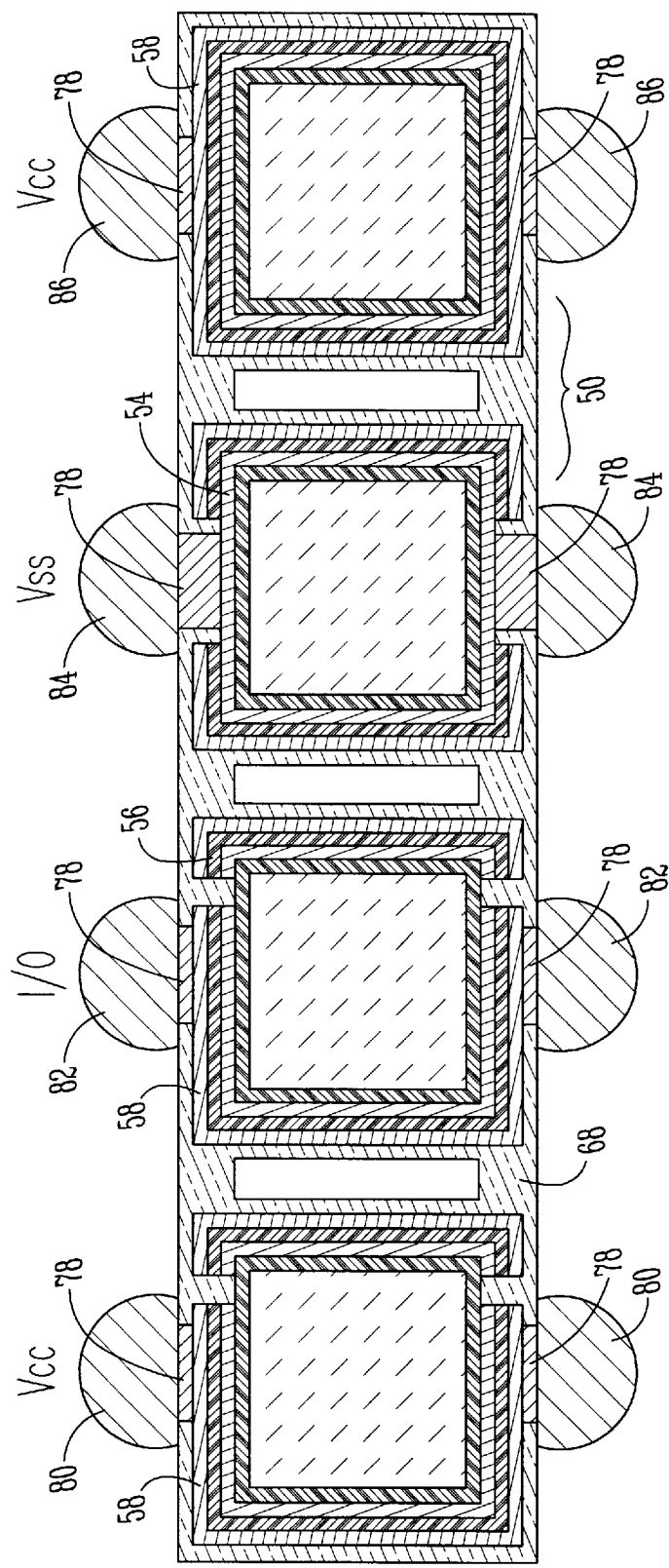

As shown in FIG. 12, another photoresist mask 70 is next formed on the passivation layer 68. This photoresist mask 70 is used to etch openings 72 within the passivation layer 68 that will be used to form electrical contacts for the interposer. As illustrated in FIG. 13, these openings 72 are subsequently filled with a conductive material to form contact pads 78 on the interposer unit. Solder bumps 80, 82, 84, 86 are then applied to the contact pads 78 for use in flip chip mounting. Referring back to FIG. 9, the notches 66 that were formed through the second metallization layer 58 and the insulating layer 56 now allow the $V_{SS}$ solder bumps 84 to be conductively coupled to the first metallization layer 54 which, as described previously, forms one plate of the de-coupling capacitor. The $V_{CC}$ solder bumps 80, 86 are conductively coupled to the second metallization layer 58 which forms the other plate of the de-coupling capacitor. The I/O solder bumps 82 are also conductively coupled to the second metallization layer 58 which provides a conductive through connection for the corresponding I/O terminal of the die. However, the notches 62, 64 that were previously formed through the first and second metallization layers 54, 58 (see FIG. 10) have isolated the portions of these layers 54, 58 in the region of the I/O connection. Thus, the de-coupling capacitance will not substantially effect the I/O through connection. Similar notches will preferably be made for each I/O terminal of the die.

The number of supply terminals that require connection through the interposer will depend upon the particular die being used. Many die, for example, include multiple supply terminals of each type (e.g., multiple $V_{CC}$ terminals and multiple $V_{SS}$ terminals). In one embodiment of the invention, each independent supply terminal pair on the die is connected to an independent de-coupling capacitor within the interposer. These independent capacitors would be isolated from one another within the interposer in a manner similar to that described above with respect to the I/O connection (e.g., by etching appropriate notches through the first and second metallization layers). In another embodiment, all of the supply terminals on the die are connected to a single capacitor within the interposer.

In the interposer unit of FIG. 13, there is a single via hole 50 between each adjacent pair of solder bumps on the interposer. It should be appreciated that any number of via holes can be used between adjacent terminals in accordance with the present invention (space permitting). As described previously, as the number of via holes forming a capacitor is increased, the series inductance and resistance associated with the capacitor will typically decrease. In one embodiment of the invention, approximately 17,000 via holes are used to form a single de-coupling capacitor. The via density in this embodiment is approximately 17,000 vias/centimeter using vias that are 50 micrometers ($\mu$m) in diameter on a 75 $\mu$m bump pitch with a depth of approximately 500 $\mu$m. Using the inventive principles, it is believed that de-coupling capacitors having capacitances of 10 microfarads/centimeter$^2$ ($\mu$F/cm$^2$) or more can be achieved. In addition, it is believed that such capacitances can be achieved with series inductance values below 10 femtohenries (fH).

As described above in connection with FIG. 1, a variety of different techniques can be used in accordance with the present invention to interconnect the die 12, the interposer unit 14, and the package substrate 16. For example, mounting techniques such as tape-automated bonding (TAB) or wire bonding can be used. In addition, combinations of different technologies can be implemented. In one embodiment, for example, flip chip techniques are used on one side of the interposer unit 14 and wire bonding is used on the other side. More complex combinations are also possible. For example, in one implementation, the die is mounted into an inverted cavity pin grid array package using wire bonding at the periphery of the die. The via capacitor is then mounted to the die using solder bumps in the center. Many other techniques and combinations of techniques can also be used.

It should be appreciated that the inventive principles are not limited to implementation within an interposer unit as described above. For example, in one embodiment of the invention, a via capacitor is implemented within an integrated circuit package (e.g., as part of the package substrate) to provide de-coupling for a corresponding die. In another embodiment, a via capacitor is implemented on the die itself. In yet another embodiment, a separate via capacitor is bonded to the die in a location that is not between the die and the package substrate. As will be apparent to persons of ordinary skill in the art, other configurations are also possible. The via capacitor can be smaller, larger, or the same size as the die. In one approach, a via capacitor is fabricated using a silicon/insulator/metal stack. In another approach, a via capacitor is fabricated using multiple or repeating metal/oxide stacks. It should also be appreciated that the inventive principles are not limited to use in providing de-coupling functions. On the contrary, the inventive principles can be implemented in any of a wide variety of different integrated circuit applications that require high performance capacitors. Furthermore, it should be understood that embodiments of the invention exist where the via holes do not extend fully through the substrate.

Although the present invention has been described in conjunction with certain embodiments, it is to be understood that modifications and variations may be resorted to without departing from the spirit and scope of the invention as those skilled in the art readily understand. For example, as will be apparent to persons of ordinary skill in the art, additional process steps (e.g., application of one or more adhesion and/or barrier layers) may be implemented during a capacitor fabrication process in accordance with the present invention. Such modifications and variations are considered to be within the purview and scope of the invention and the appended claims.

What is claimed is:

1. A capacitor comprising:

a substrate having a first via hole;

a first capacitor plate having a first metallic plating portion within said first via hole;

a second capacitor plate having a second metallic plating portion within said first via hole; and an insulating layer between said first metallic plating portion and said second metallic plating portion within said first via hole.

2. The capacitor claimed in claim 1, wherein:

said substrate includes a second via hole and said first and second capacitor plates each include a metallic plating portion within said second via hole.

3. The capacitor claimed in claim 1, wherein:

said substrate includes at least one hundred via holes and said first and second capacitor plates each include a metallic plating portion within each of said at least one hundred via holes.

4. The capacitor claimed in claim 1, wherein:

said substrate includes at least one thousand via holes and said first and second capacitor plates each include a metallic plating portion within each of said at least one thousand via holes.

5. The capacitor claimed in claim 1, wherein:

said substrate is made of a semiconductor material.

6. The capacitor claimed in claim 1, wherein:

said first metallic plating portion includes ruthenium.

7. The capacitor claimed in claim 1, wherein:

said insulating layer includes tantalum pentoxide ($Ta_2O_5$).

8. An interposer unit to provide electrical communication between a die and an integrated circuit (IC) package, comprising:

a substrate having a first plurality of via holes;

a de-coupling capacitor including:

a first capacitor plate having a first metallic plating portion within each of said first plurality of via holes;

a second capacitor plate having a second metallic plating portion within each of said first plurality of via holes; and an insulating layer separating said first metallic plating portion and said second metallic plating portion within each of said first plurality of via holes;

a first electrical terminal to connect said interposer unit to a first supply terminal of the die, said first electrical terminal being conductively coupled to said first capacitor plate; and a second electrical terminal to connect said interposer unit to a second supply terminal of the die, said second electrical terminal being conductively coupled to said second capacitor plate.

9. The interposer unit claimed in claim 8, wherein:

said first and second electrical terminals include contact pads on said substrate.

10. The interposer unit claimed in claim 8, wherein:

said first and second electrical terminals include solder bumps on said substrate.

11. The interposer unit claimed in claim 8, comprising:
a third electrical terminal to connect said interposer unit to an input/output terminal of the die, said third electrical terminal being electrically isolated from said first and second capacitor plates within said interposer unit.

12. The interposer unit claimed in claim 8, comprising:
a third electrical terminal to couple said interposer unit to an input/output terminal of the die and a fourth electrical terminal to couple said interposer unit to a corresponding terminal of the IC package, said third electrical terminal being conductively coupled to said fourth electrical terminal through at least one dedicated via hole within said substrate, wherein said at least one dedicated via hole is not within said first plurality of via holes.

13. The interposer unit claimed in claim 8, comprising:
a plurality of through connections to each connect an input/output terminal of the die to a corresponding terminal of the IC package, each of said plurality of through connections including at least one metallic member extending through a via hole within said substrate.

14. The interposer unit claimed in claim 8, wherein said substrate includes a second plurality of via holes, said interposer unit further comprising:
a second de-coupling capacitor including:
a third capacitor plate having a third metallic plating portion within each of said second plurality of via holes;
a fourth capacitor plate having a fourth metallic plating portion within each of said second plurality of via holes; and
an insulating layer separating said third metallic plating portion and said fourth metallic plating portion within each of said second plurality of via holes;
a fifth electrical terminal to connect said interposer unit to a third supply terminal of the die, said fifth electrical terminal being conductively coupled to said third capacitor plate; and
a sixth electrical terminal to connect said interposer unit to a fourth supply terminal of the die, said sixth electrical terminal being conductively coupled to said fourth capacitor plate;
wherein said third and fourth capacitor plates are electrically isolated from said first and second capacitor plates within said interposer unit.

15. A digital processing device comprising:
a die having processing circuitry disposed thereon;
an integrated circuit (IC) package having a package substrate; and
an interposer unit located between said die and said package substrate to provide electrical communication between said die and said package substrate, said interposer unit including:
a substrate having a first plurality of via holes;
a de-coupling capacitor including:
a first capacitor plate having a first metallic plating portion within each of said first plurality of via holes;
a second capacitor plate having a second metallic plating portion within each of said first plurality of via holes; and
an insulating layer separating said first metallic plating portion and said second metallic plating portion within each of said first plurality of via holes;
a first plurality of electrical terminals on a first side of said substrate that are connected to corresponding terminals on said die; and
a second plurality of electrical terminals on a second side of said substrate that are connected to corresponding terminals on said package substrate.

16. The digital processing device claimed in claim 15, wherein:
said first plurality of electrical terminals includes a first electrical terminal that is coupled to a first supply terminal of said die, said first electrical terminal being conductively coupled to said first capacitor plate within said interposer unit.

17. The digital processing device claimed in claim 16, wherein:
said first plurality of electrical terminals includes a second electrical terminal that is coupled to a second supply terminal of said die, said second electrical terminal being conductively coupled to said second capacitor plate within said interposer unit.

18. The digital processing device claimed in claim 15, wherein:
said first plurality of electrical terminals are connected to said corresponding terminals on said die using flip chip techniques.

19. The digital processing device claimed in claim 15, wherein:
said second plurality of electrical terminals are connected to said corresponding terminals on said package substrate using flip chip techniques.

20. The digital processing device claimed in claim 15, wherein:
said first plurality of electrical terminals includes a third electrical terminal that is connected to an input/output terminal of said die, said third electrical terminal being electrically isolated from said first and second capacitor plates within said interposer unit.

21. The digital processing device claimed in claim 15, wherein:
each of said first plurality of electrical terminals of said interposer unit is conductively coupled to a corresponding one of said second plurality of electrical terminals of said interposer unit through one or more associated via holes within said substrate.

22. A capacitor comprising:
a substrate having a plurality of via holes;
a first conductive layer covering at least a portion of an upper surface of the substrate and inner surfaces of the plurality of via holes;
an insulating layer covering said first conductive layer, said insulating layer extending into said plurality of via holes; and
a second conductive layer covering said insulating layer, said second conductive layer extending into said plurality of via holes;
wherein said first conductive layer forms a first plate of the capacitor and said second conductive layer forms a second plate of the capacitor.

23. The capacitor of claim 22, wherein:
said substrate is formed of a semiconductor material.

24. The capacitor of claim 22, comprising:
an isolation layer between said first conductive layer and said substrate.

25. The capacitor of claim 22, wherein:
said plurality of via holes includes at least one via hole having an aspect ratio greater than 7:1.

* * * * *

UNITED STATES PATENT AND TRADEMARK OFFICE
CERTIFICATE OF CORRECTION

PATENT NO. : 6,525,922 B2
DATED : February 25, 2003
INVENTOR(S) : Paul Winer et al.

It is certified that error appears in the above-identified patent and that said Letters Patent is hereby corrected as shown below:

<u>Title page,</u>
Item [56], References Cited, U.S. PATENT DOCUMENTS, insert -- 361/321.3 -- after "Smith et al.", insert -- 505/192 -- after "Ruby";
and after "*Assistant Examiner*", delete "Ha I Nguyen" and insert -- Nguyen T Ha -- therefor.

<u>Column 5,</u>
Line 39, delete "$S_tO_2$" and insert -- $SiO_2$ -- therefor.

<u>Column 7,</u>
Line 14, delete "vias/centimeter" and insert -- vias/centimeter$^2$ -- therefor.

Signed and Sealed this

Second Day of August, 2005

JON W. DUDAS
*Director of the United States Patent and Trademark Office*